United States Patent [19]

Madni

[11] Patent Number: 5,572,165
[45] Date of Patent: Nov. 5, 1996

[54] AMPLIFIER ARRANGEMENTS

[75] Inventor: Arshad Madni, Wiltshire, United Kingdom

[73] Assignee: Plessey Semiconductors Limited, United Kingdom

[21] Appl. No.: 295,620

[22] Filed: Aug. 25, 1994

[30] Foreign Application Priority Data

Sep. 10, 1993 [GB] United Kingdom ............... 93188836

[51] Int. Cl.$^6$ .................................................. H03F 3/45
[52] U.S. Cl. ............................................ 330/252; 330/311
[58] Field of Search ................................. 330/69, 124 R, 330/150, 252, 295, 311

[56] References Cited

U.S. PATENT DOCUMENTS 4,007,427  2/1977  Leidich ................................... 330/252
4,797,629  1/1989  Widlar .................................... 330/258
4,864,248  9/1989  Jansen .................................... 330/254
4,866,397  9/1989  Kimyacioglu ......................... 330/252
4,928,073  5/1990  Arai et al. .............................. 330/252
5,017,886  5/1991  Geller .................................... 330/277

FOREIGN PATENT DOCUMENTS 0156410   10/1985  European Pat. Off. .
0511707A1 11/1992  European Pat. Off. .
2217541   10/1989  United Kingdom .

Primary Examiner—Steven Mottola
Attorney, Agent, or Firm—Kirschstein, et al.

[57] ABSTRACT

An amplifier arrangement comprising a plurality of similar amplifier stages to which input signal voltages are applied in common, the output signal voltages being summed to retain bandwidth at the expense of gain compared with cascaded stages. The individual stages of the arrangement may be cascoded amplifier stages.

7 Claims, 2 Drawing Sheets

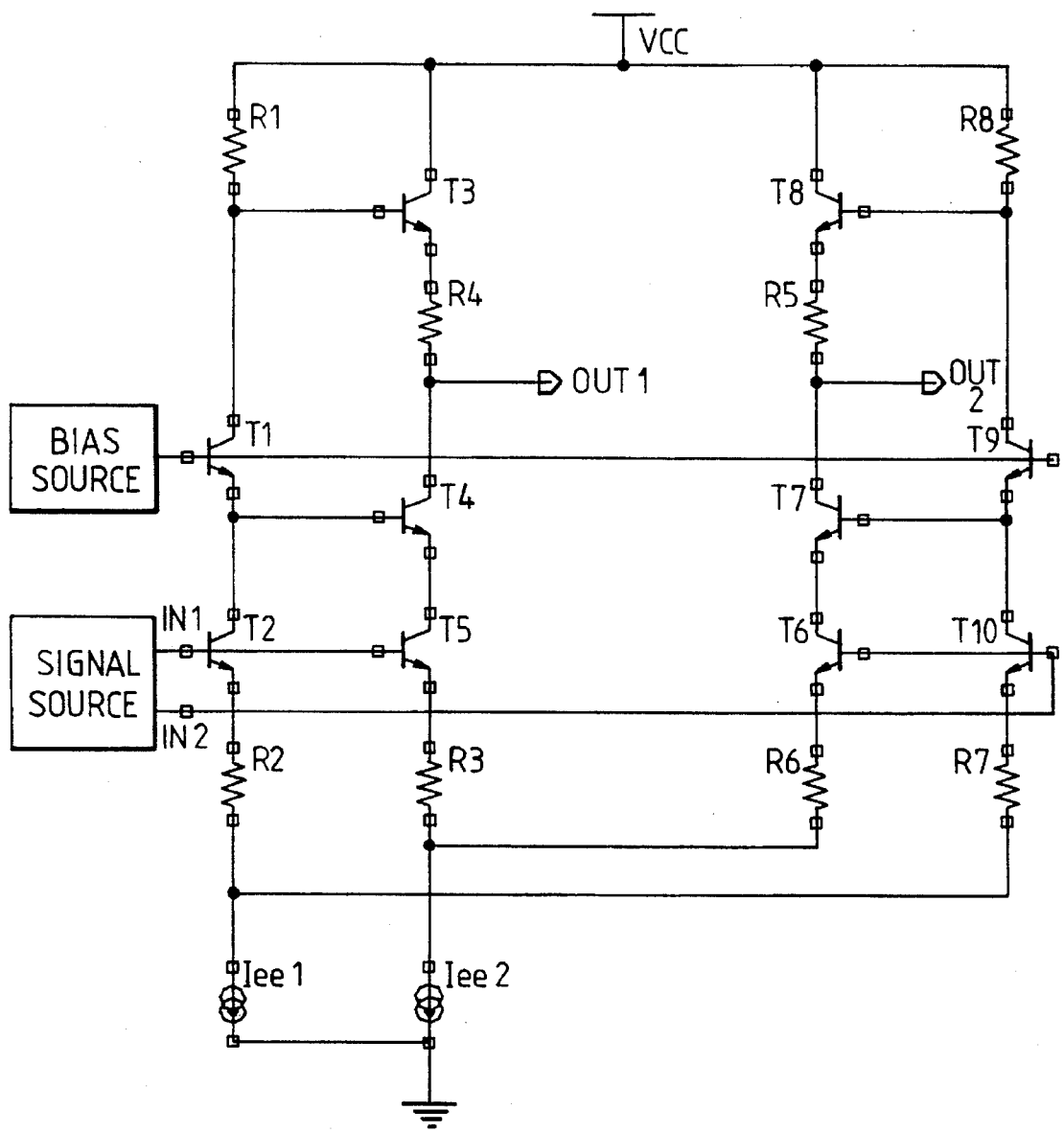

AMPLIFIER ARRANGEMENTS

BACKGROUND OF THE INVENTION

The present invention relates to amplifier arrangement, and in particular to amplifier arrangements comprising a plurality of amplifier stages.

SUMMARY OF THE INVENTION

According to one aspect of the present invention an amplifier arrangement comprises a plurality of amplifier stages to which input signal voltages are applied in common and means to sum the output signal voltages of said amplifier stages.

According to another aspect of the present invention an amplifier arrangement comprises at least two amplifier stages to which input signal voltages are applied in common and output load means, output signal voltages from one of said two amplifier stages being arranged to be developed at one terminal of said load means and output signal voltages from the other of said two amplifier stages being arranged to be developed across said load means, whereby the sum of said output signals is developed at the other terminal of said load means.

Each of said amplifier stages may comprise one half of a respective long tail pair stage to respective inputs of which said input signal voltages are applied in antiphase, said output signal voltages being derived in antiphase from respective output load means.

BRIEF DESCRIPTION OF THE DRAWINGS

Amplifier arrangements in accordance with the present invention will now be described with reference to the accompanying drawings, of which:

FIG. 2 shows another arrangement diagrammatically.

DETAILED DESCRIPTION OF THE PREFERRED EMBODIMENT

Figure 1:
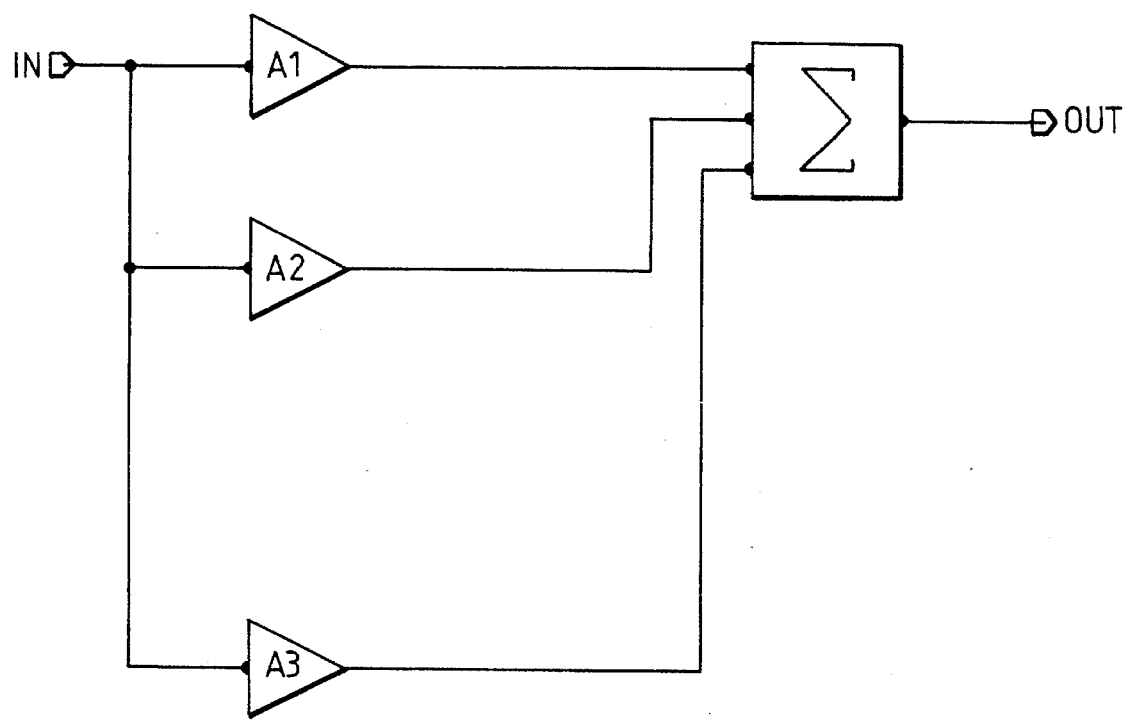
FIG. 1 shows an amplifier arrangement schematically.

Referring to FIG. 1, a plurality of amplifier stages A1, A2, A3 receiving input signals in common each provide voltage gain with a given bandwidth, and their output signals are summed. The overall voltage Gv of the arrangement may be represented as:

$$Gv = f(\Sigma) \sum_i A_i \frac{1}{\Pi_i(1+st_i)}$$

where $f(\Sigma)$ is the transfer function of the summing block, $A_i$ are the midband gains of the amplifiers A1, A2 etc., and $t_i$ are time constants of the amplifiers related to their bandwidths.

In the case of cascaded amplifiers stages the overall transfer function would be:

$$Gv = \Pi_i A_i \left( \frac{1}{1+st_i} \right)$$

It can be seen that the overall bandwidth achieved with the cascaded amplifier stages is lower than that achieved from gain summming.

Referring to FIG. 2, a summing arrangement for two amplifier stages is shown, each stage comprising a cascoded long tail pair transistor amplifier. One stage is formed by transistors T1, T2, T9 and T10, with load resistors R1 and R8, and the other by transistors T4, T5, T6 and T7 with load resistors R4 and R5. Emitter followers T3 and T8 apply the output voltage signals from the stage comprising the transistors T1, T2 and T9, T10, developed across resistors R1 and R8, to the top ends or terminals of resistors R4 and R5 respectively, while the output voltage signals from the stage comprising the transistors T4, T5 and T6, T7 are developed across these load resistors R4 and R5. Thus the sum of the output voltages developed in the two stages in response to input voltages applied at the terminals In1 and In2 appear at the terminals Out1 and Out2.

If a third amplifier stage (not shown) is used, it will be appreciated that the output voltage signals at the terminals Out1 and Out2 may be applied by way of respective emitter follower stages (not shown) to the top ends of the load resistors (not shown) of that third stage, the sum of the three output voltage signals being obtained at the other end of these load resistors.

It will further be appreciated that gain summing in accordance with the present invention may be achieved with circuits other than cascoded long tail pairs.

I claim:

1. An amplifier arrangement comprising first and second cascoded transistor amplifier stages, means to apply input signal voltages in common to input terminals of said first and second amplifier stages, first and second resistive load means in said first and second amplifier stages across which first and second output signal voltages are developed respectively, and an emitter follower stage arranged to apply said first output signal voltage to one end of said second resistive load means such that the sum of said first and second output signal voltages is developed at the other end of said second resistive load means.

2. An amplifier arrangement in accordance with claim 1 wherein each of aid first and second amplifier stages is a long tail pair amplifier stage to inputs of which said input signal voltages are applied in antiphase.

3. An amplifier arrangement, comprising: first, second, third, fourth and fifth junction transistors each having emitter, base and collector electrodes; first and second load resistors each having first and second end terminals; means for connecting emitter to collector paths of said first and second transistors in series with said first load resistor to form a first cascode amplifier stage having an output terminal connected to one of said end terminals of said first load resistor; means for connecting emitter to collector paths of said third and fourth transistors in series with said second load transistor to form a second cascode amplifier stage having an output terminal connected to the first end terminal of said second load resistor; and means for connecting said fifth transistor as an emitter follower having its base electrode connected to the output terminal of said first cascode amplifier stage and its emitter electrode connected to the second end terminal of said second load resistor.

4. An amplifier arrangement in accordance with claim 3, and further comprising means for applying input signals in common to the base electrodes of said first and third transistors; means for applying a substantially fixed bias potential to the base electrode of said second transistor; and means for connecting the emitter electrode of said second transistor to the base electrode and said fourth transistor.

5. An amplifier arrangement in accordance with claim 3, and further comprising sixth, seventh, eighth, ninth and tenth junction transistors connected in like manner to said first to fifth transistors to form third and fourth cascode amplifier stages; and means for connecting said first and third cascode amplifier stages and said second and fourth cascode amplifier stages as respective differential pairs.

6. An amplifier arrangement, comprising: at least two amplifier stages to which input signal voltages are applied in common, and output load means, output signal voltages from one of said two amplifier stages being arranged to be developed at one terminal of said load means by way of an emitter follower stages, and output signal voltages from the other of said two amplifier stages being arranged to be developed across said load means, whereby the sum of said output signal voltages is developed at the other terminal of said load means.

7. An amplifier arrangement in accordance with claim 6, wherein each of said amplifier stages comprises a long tail pair stage to respective inputs of which said input signal voltages are applied in antiphase, said output signal voltages being derived in antiphase from respective output load means.

* * * * *